US009831108B2

(12) United States Patent
Yokouchi et al.

(10) Patent No.: US 9,831,108 B2
(45) Date of Patent: Nov. 28, 2017

(54) THERMAL PROCESSING APPARATUS AND THERMAL PROCESSING METHOD FOR HEATING SUBSTRATE BY LIGHT IRRADIATION

(71) Applicant: DAINIPPON SCREEN MFG. CO., LTD., Kyoto (JP)

(72) Inventors: Kenichi Yokouchi, Kyoto (JP); Nobuhiko Nishide, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 161 days.

(21) Appl. No.: 14/081,013

(22) Filed: Nov. 15, 2013

(65) Prior Publication Data

US 2014/0161429 A1    Jun. 12, 2014

(30) Foreign Application Priority Data

Dec. 12, 2012    (JP) .................................. 2012-271573

(51) Int. Cl.
*H01L 21/67* (2006.01)
(52) U.S. Cl.
CPC .............................. *H01L 21/67115* (2013.01)
(58) Field of Classification Search
CPC combination set(s) only.
See application file for complete search history.

(56) References Cited

U.S. PATENT DOCUMENTS

| 5,332,443 A | * | 7/1994 | Chew | ................... C23C 16/4583 118/715 |
| 5,421,893 A | * | 6/1995 | Perlov | ............... H01L 21/67115 118/725 |
| 5,826,345 A | * | 10/1998 | Hendricks | ................ G01C 9/28 33/365 |
| 6,222,990 B1 | * | 4/2001 | Guardado | ............... C30B 25/10 118/724 |

(Continued)

FOREIGN PATENT DOCUMENTS

| JP | H08-187426 | 7/1996 |
| JP | 2002-176002 | 6/2002 |

(Continued)

OTHER PUBLICATIONS

Taiwanese Office Action dated Dec. 21, 2015 with English translation based on the Japanese translation.

(Continued)

*Primary Examiner* — Anne M Antonucci
*Assistant Examiner* — Renee M Larose
(74) *Attorney, Agent, or Firm* — Ostrolenk Faber LLP

(57) ABSTRACT

A susceptor that holds a semiconductor wafer placed thereon is capable of moving up and down inside a chamber. For preheating with a halogen lamp, the susceptor moves to a preheating position. The preheating position is a height of the susceptor that achieves the most uniform in-plane illumination distribution of light emitted from the halogen lamp and applied to the semiconductor wafer. After the preheating is finished, the susceptor moves to a flash heating position (Continued)

for irradiation with a flash from a flash lamp. The flash heating position is a height of the susceptor that achieves the most uniform in-plane illumination distribution of a flash emitted from the flash lamp and applied to the semiconductor wafer.

3 Claims, 14 Drawing Sheets

(56) References Cited

U.S. PATENT DOCUMENTS

| | | | |
|---|---|---|---|
| 6,790,687 B2* | 9/2004 | Yoshimura | G01J 5/0003 438/14 |
| 6,859,616 B2* | 2/2005 | Kusuda | H05B 3/0047 118/724 |
| 6,998,580 B2 | 2/2006 | Kusuda et al. | 219/411 |
| 7,041,939 B2 | 5/2006 | Hosokawa | |
| 7,184,657 B1 | 2/2007 | Camm et al. | |
| 7,381,928 B2 | 6/2008 | Kusuda et al. | 219/411 |
| 8,111,978 B2 | 2/2012 | Sorabji et al. | |
| 8,624,165 B2* | 1/2014 | Kusuda | H01L 21/67115 118/50.1 |
| 2002/0195437 A1* | 12/2002 | Kusuda | H01L 21/67115 219/390 |
| 2003/0183612 A1* | 10/2003 | Timans | C30B 31/12 219/390 |
| 2004/0112890 A1* | 6/2004 | Kusuda | H05B 3/0047 219/520 |
| 2005/0115947 A1 | 6/2005 | Hosokawa | |
| 2005/0263719 A1 | 12/2005 | Ohdaira et al. | |
| 2006/0081596 A1* | 4/2006 | Kusuda | F27B 17/0025 219/411 |
| 2006/0291835 A1* | 12/2006 | Nozaki | H01L 21/68735 392/416 |
| 2007/0215049 A1* | 9/2007 | Aderhold | H01L 21/67115 118/728 |
| 2007/0246065 A1* | 10/2007 | Wen | B01D 11/02 134/2 |
| 2008/0000551 A1* | 1/2008 | Sato | H01L 21/3144 148/222 |
| 2008/0017114 A1* | 1/2008 | Watanabe | H01L 21/67017 118/725 |
| 2008/0116196 A1* | 5/2008 | Nakajima | H05B 3/0047 219/521 |
| 2008/0190909 A1* | 8/2008 | Yokouchi | F27B 17/0025 219/385 |
| 2009/0175605 A1 | 7/2009 | Kobayashi | 392/416 |
| 2010/0008656 A1 | 1/2010 | Sorabji et al. | |
| 2011/0274417 A1* | 11/2011 | Camm | H01L 21/67115 392/411 |
| 2012/0067864 A1 | 3/2012 | Kusuda et al. | 219/385 |
| 2012/0244725 A1* | 9/2012 | Fuse | H01L 21/26513 438/799 |

FOREIGN PATENT DOCUMENTS

| | | |
|---|---|---|
| JP | 2003-282558 | 10/2003 |
| JP | 2004-055821 | 2/2004 |
| JP | 2004-186542 | 7/2004 |
| JP | 2005-166770 | 6/2005 |
| JP | 2005-340665 | 12/2005 |
| JP | 2009-164388 | 7/2009 |
| JP | 2010-123637 | 6/2010 |
| JP | 2010-225645 | 10/2010 |
| JP | 2011-527837 | 11/2011 |
| KR | 10-2007-0074020 | 7/2007 |
| KR | 10-2011-0137662 | 12/2011 |

OTHER PUBLICATIONS

Decision to Grant a Patent dated Aug. 9, 2016, issued for a Japanese counterpart of the present application (U.S. Appl. No. 14/081,013). No English translation is being provided as the Decision does not comment on the referenced documents.
Japanese Office Action dated Apr. 12, 2016 with English translation of portions relevant to prior-art based rejections.
Korean Office Action dated Feb. 27, 2015 in connection with Korean Application No. 10-2013-0152310 with English and Japanese translation of relevant parts.

* cited by examiner

F I G. 2
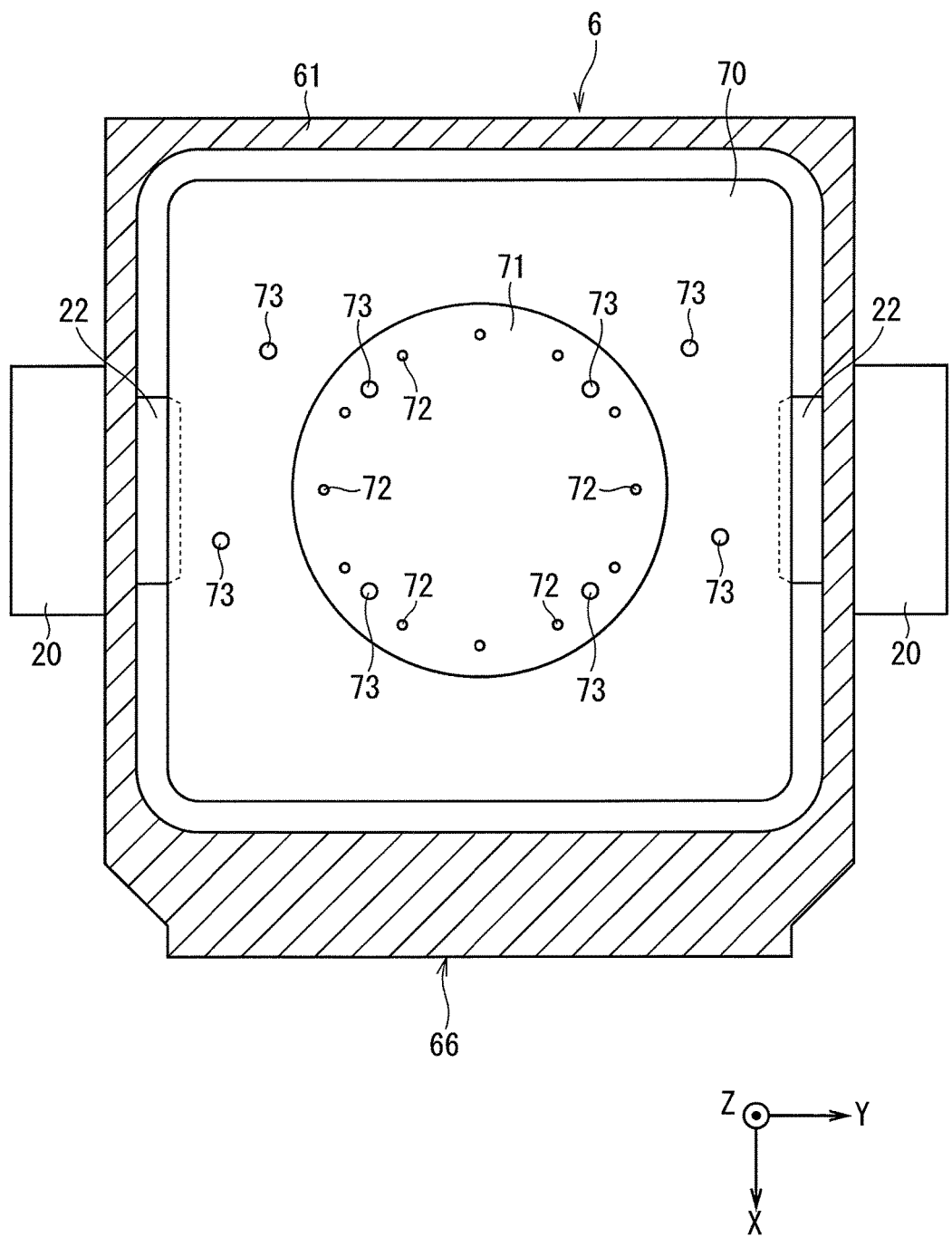

F I G. 5
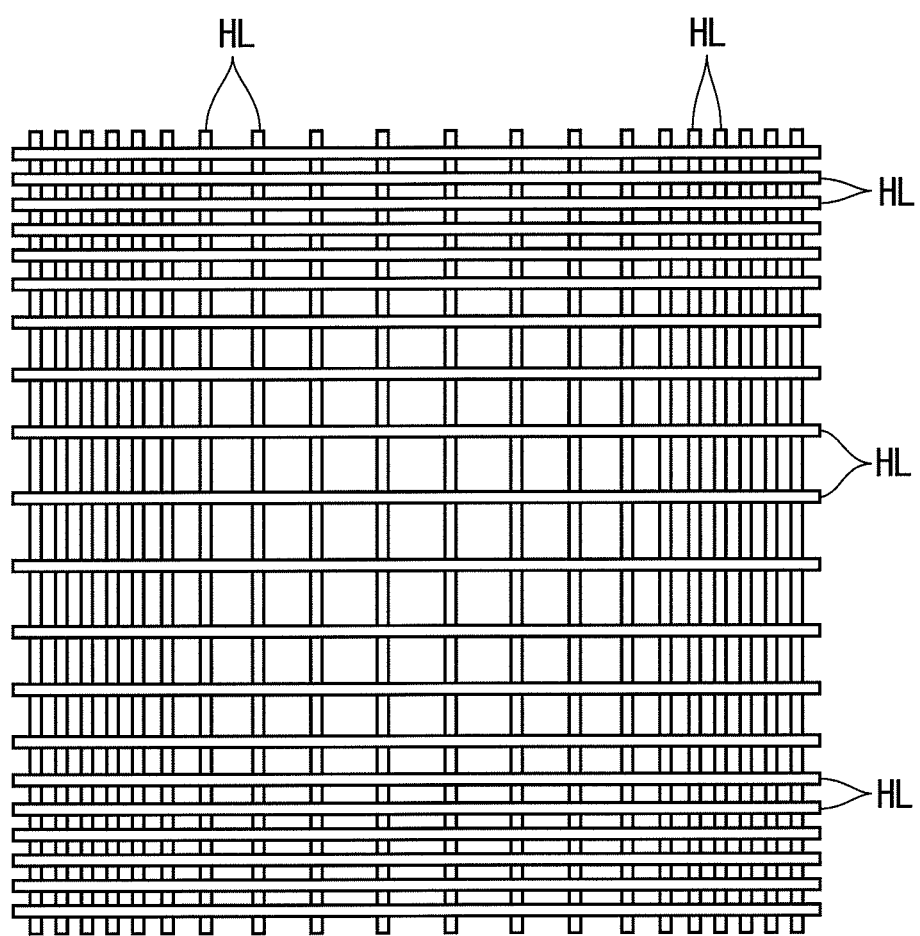

1

THERMAL PROCESSING APPARATUS AND THERMAL PROCESSING METHOD FOR HEATING SUBSTRATE BY LIGHT IRRADIATION

BACKGROUND OF THE INVENTION

Field of the Invention

The present invention relates to a thermal processing apparatus and a thermal processing method for heating a precision electronic substrate (hereinafter simply called a "substrate") in the form of a thin plate such as a semiconductor wafer or a glass substrate for a liquid crystal display by irradiating the substrate with light.

Description of the Background Art

Impurity introduction performed to form a pn junction in a semiconductor wafer is an essential step in manufacturing process of a semiconductor device. At present, impurities are introduced generally by ion implantation process and subsequent annealing process. The ion implantation process is a technique of implanting impurities physically by ionizing an impurity element such as boron (B), arsenic (As) or phosphorous (P) and making the impurity ions collide with the semiconductor wafer at a highly accelerated voltage. The implanted impurities are activated by the annealing process. If the annealing takes about several seconds or more, the implanted impurities are diffused deeply by heat and a resultant junction reaches a depth greater than is necessary. This might become an obstacle to favorable formation of the device.

Flash lamp annealing (FLA) has attracted attention in recent years as an annealing technique of heating a semiconductor wafer within an extremely short time. The flash lamp annealing is a thermal processing technique of increasing the temperature only of a front surface with implanted impurities of a semiconductor wafer within an extremely short time by irradiating the front surface of the semiconductor wafer with a flash using a xenon flash lamp (in the below, a lamp simply called a "flash lamp" means a xenon flash lamp).

The spectral distribution of light emitted from a xenon flash lamp ranges from an ultraviolet region to a near-infrared region, has a shorter wavelength than light from a conventional halogen lamp, and substantially agrees with the base absorption band of a silicon semiconductor wafer. Thus, irradiating a semiconductor wafer with a flash from the xenon flash lamp does not produce much transmitted light so that the temperature of the semiconductor wafer can be increased rapidly. Additionally, it has become known that irradiation with a flash within an extremely short time of several milliseconds or less can increase the temperature only of a front surface and its vicinity of the semiconductor wafer selectively. As a result, increasing a temperature within an extremely short time with the xenon flash lamp can realize only activation of impurities without causing deep diffusion of the impurities.

US 2009/0175605 discloses a thermal processing apparatus using such a xenon flash lamp. In this thermal processing apparatus, the flash lamp and a halogen lamp are arranged on the sides of a front surface and a back surface respectively of a semiconductor wafer, and desirable thermal processing is realized by a combination of these lamps. In the thermal processing apparatus of US 2009/0175605, the semiconductor wafer held on a susceptor is preheated to a certain temperature with the halogen lamp, and then is heated to a desirable processing temperature by being irradiated with a flash from the flash lamp.

Regarding heating of a semiconductor wafer by light irradiation, what is important is to make an illumination distribution uniform to achieve better uniformity of a temperature distribution in the plane of a wafer, regardless of whether a light source is a flash lamp or a halogen lamp. Meanwhile, in a flash lamp annealing apparatus such as that of US 2009/0175605, a flash lamp and a halogen lamp are arranged above and below a chamber respectively, and the front and the back of a semiconductor wafer held on a susceptor are irradiated with light. Hence, even if a uniform illumination distribution in the plane of the wafer is achieved during irradiation of light from the halogen lamp, for example, the illumination distribution may become non-uniform during irradiation of a flash from the flash lamp. This has made it difficult to achieve a uniform temperature distribution during both irradiation of light from the flash lamp and irradiation of light from the halogen lamp.

SUMMARY OF THE INVENTION

The present invention is intended for a thermal processing apparatus for heating a substrate by irradiating the substrate with light.

According to an aspect of this invention, the thermal processing device includes: a chamber that houses a substrate; a susceptor that holds a substrate placed thereon inside the chamber; a halogen lamp that preheats the substrate held on the susceptor to a given preheating temperature by irradiating one surface of the substrate with light; a flash lamp that irradiates an opposite surface of the preheated substrate with a flash; an up-and-down driving unit that moves the susceptor up and down; and an up-and-down controller that controls the up-and-down driving unit to move the susceptor holding the substrate to a first position for preheating with the halogen lamp and to move the susceptor to a second position for irradiation with a flash from the flash lamp.

The flash lamp and the halogen lamp each emit light from an appropriate distance, thereby achieving a uniform in-plane temperature distribution of a substrate during light irradiation.

Preferably, the up-and-down controller is configured to control the up-and-down driving unit to move the susceptor back and forth within a certain range covering the first position.

This achieves a more uniform in-plane temperature distribution of a substrate during preheating.

Preferably, the thermal processing apparatus further includes a transfer pin at a fixed height. The transfer pin transfers and receives a substrate to and from the susceptor in response to moving up and down of the susceptor.

This allows reduction of a volume inside the chamber.

Preferably, the thermal processing apparatus further includes a tilting mechanism that tilts the susceptor relative to a horizontal plane.

This achieves a more uniform in-plane temperature distribution of a substrate.

Preferably, the thermal processing apparatus further includes a rotating mechanism that rotates the susceptor.

This achieves a more uniform in-plane temperature distribution of a substrate.

Preferably, the thermal processing apparatus further includes a buffering mechanism that absorbs an impact on the susceptor.

An impact on the susceptor to be given from a substrate during irradiation with a flash is absorbed, thereby preventing a crack in the substrate.

The present invention is also intended for a thermal processing method for heating a substrate by irradiating the substrate with light.

According to an aspect of this invention, the thermal processing method includes the steps of: (a) moving a susceptor holding a substrate placed thereon up and down inside a chamber to a first position; (b) preheating the substrate held on the susceptor to a given preheating temperature by irradiating one surface of the substrate with light emitted from a halogen lamp; (c) moving the susceptor up and down to a second position, the step (c) being performed after the step (b); and (d) irradiating an opposite surface of the preheated substrate with a flash emitted from a flash lamp.

The flash lamp and the halogen lamp each emit light from an appropriate distance, thereby achieving a uniform in-plane temperature distribution of a substrate during light irradiation.

Preferably, in the step (b), the susceptor is moved back and forth within a certain range covering the first position.

This achieves a more uniform in-plane temperature distribution of a substrate during preheating.

Preferably, in the step (b), the susceptor is tilted relative to a horizontal plane.

This achieves a more uniform in-plane temperature distribution of a substrate during preheating.

Preferably, in the step (b), the susceptor is rotated.

This achieves a more uniform in-plane temperature distribution of a substrate during preheating.

Thus, it is an object of the present invention to achieve a uniform in-plane temperature distribution of a substrate during light irradiation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view of a chamber;

FIG. 5 is a plan view showing the arrangement of a plurality of halogen lamps;

DESCRIPTION OF THE PREFERRED EMBODIMENTS

Figure 1:
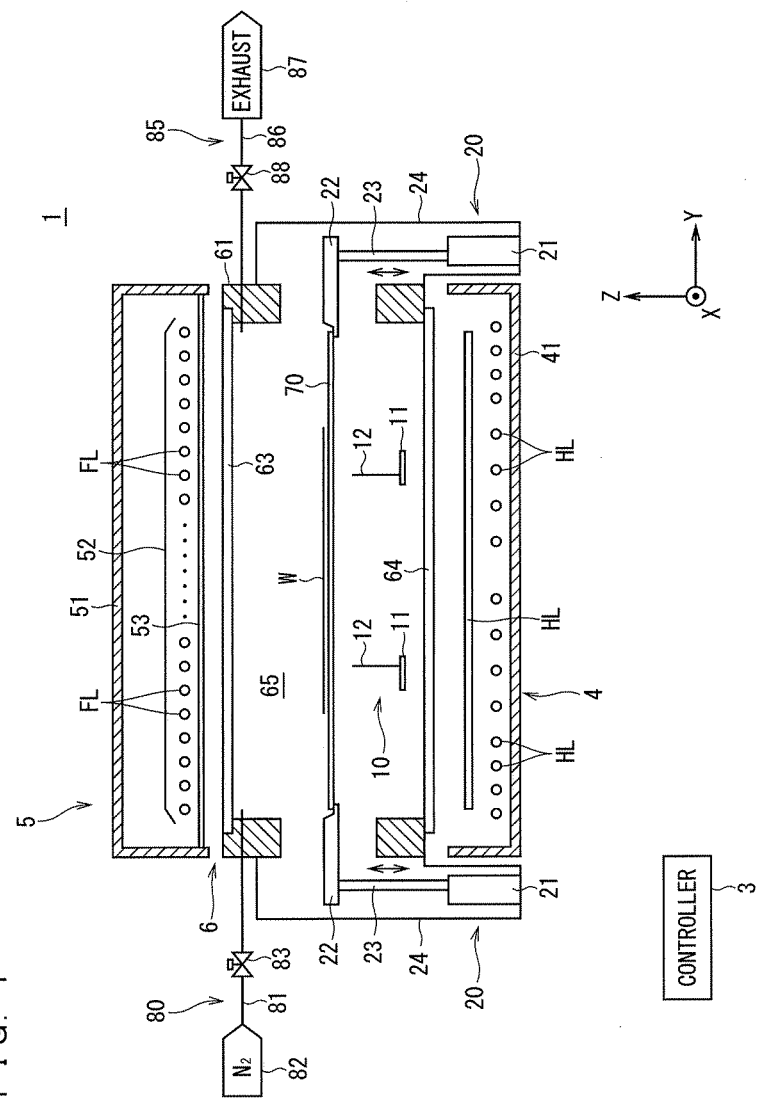
FIG. 1 is a vertical sectional view showing the structure of a thermal processing apparatus of the present invention.

Preferred embodiments of the present invention are described in detail below by referring to the drawings.

First Preferred Embodiment

FIG. 1 is a vertical sectional view showing the structure of a thermal processing apparatus 1 of the present invention. The thermal processing apparatus 1 of a first preferred embodiment is a flash lamp annealing apparatus that heats a semiconductor wafer W of a circular plate shape as a substrate by irradiating the semiconductor wafer W with a flash. Although not specifically limited, the size of a semiconductor wafer W to be processed is 300 mm or 450 mm in diameter, for example. A semiconductor wafer W before being transported into the thermal processing apparatus 1 contains implanted impurities. The implanted impurities are activated by being heated in the thermal processing apparatus 1. In order to show relationships of directions among FIG. 1 and its subsequent figures, an XYZ rectangular coordinate system defining a Z-axis direction as a vertical direction and defining an XY plane as a horizontal plane is given to FIG. 1 and its subsequent figures, where appropriate. In order to facilitate understanding, in FIG. 1 and its subsequent figures, the dimensions of components and the numbers of the components are exaggerated or simplified where appropriate.

The thermal processing apparatus 1 includes a chamber 6 to house a semiconductor wafer W, a flash heating unit 5 with a plurality of built-in flash lamps FL, and a halogen heating unit 4 with a plurality of built-in halogen lamps HL. The flash heating unit 5 and the halogen heating unit 4 are arranged above and below the chamber 6 respectively. The thermal processing apparatus 1 includes a controller 3 that controls the halogen heating unit 4, the flash heating unit 5, and each operating mechanism of the chamber 6 to realize thermal process on a semiconductor wafer W.

FIG. 2 is a plan view of the chamber 6. The chamber 6 is composed of a chamber side wall section 61 of a columnar shape substantially rectangular in plan view, and chamber windows made of quartz attached to upper part and lower part of the chamber side wall section 61. The chamber side wall section 61 is substantially columnar with an open upper part and an open lower part. An upper chamber window 63 is attached to the upper opening to close the upper opening. A lower chamber window 64 is attached to the lower opening to close the lower opening. The chamber side wall section 61 is made of a metallic material having excellent strength and resistance to heat (such as stainless steel).

The upper chamber window 63 forming a ceiling part of the chamber 6 is a plate-like member made of quartz. The upper chamber window 63 functions as a quarts window to cause flashes emitted from the flash heating unit 5 to reach the inside of the chamber 6. The lower chamber window 64 forming a floor part of the chamber 6 is also a plate-like member made of quarts. The lower chamber window 64 functions as a quarts window to cause light emitted from the halogen heating unit 4 to reach the inside of the chamber 6. Space inside the chamber 6, specifically the space surrounded by the upper chamber window 63, the lower chamber window 64, and the chamber side wall section 61 is defined as thermal processing space 65.

A transport opening section (furnace opening) 66 is provided on the (+X) side of the chamber side wall section 61 through which a semiconductor wafer W is transported into and out of the chamber 6. The transport opening section 66 can be opened and closed with a gate valve not shown in the drawings. While the gate valve opens the transport opening section 66, a semiconductor wafer W can be transported into and out of the thermal processing space 65 through the transport opening section 66. When the gate valve closes the transport opening section 66, the thermal processing space 65 inside the chamber 6 becomes hermetically sealed space.

The thermal processing apparatus 1 includes a gas supply unit 80 to supply processing gas into the thermal processing space 65 inside the chamber 6 and an exhaust unit 85 to exhaust air from the chamber 6. The gas supply unit 80 includes a gas supply pipe 81, and a gas supply source 82 and a supply valve 83 provided to the gas supply pipe 81. A tip end of the gas supply pipe 81 communicates with the thermal processing space 65 inside the chamber 6, and a base end of the gas supply pipe 81 is connected to the gas supply source 82. The supply valve 83 is interposed in a pathway of the gas supply pipe 81. The gas supply source 82 delivers processing gas (in the first preferred embodiment, nitrogen ($N_2$) gas) to the gas supply pipe 81. Opening the supply valve 83 supplies the processing gas into the thermal processing space 65. The gas supply source 82 may be composed of a gas tank and a feed pump provided in the thermal processing apparatus 1. Alternatively, gas prepared in a factory where the thermal processing apparatus 1 is placed may be used. The processing gas is not limited to nitrogen gas but it may also be an inert gas such as argon (Ar) or helium (He), or may be a reactive gas such as oxygen ($O_2$), hydrogen ($H_2$), chlorine ($Cl_2$), hydrogen chloride (HCl), ozone ($O_3$), or ammonia ($NH_3$).

The exhaust unit 85 includes a gas exhaust pipe 86, and an exhaust device 87 and an exhaust valve 88 provided to the gas exhaust pipe 86. A tip end of the gas exhaust pipe 86 communicates with the thermal processing space 65 inside the chamber 6, and a base end of the gas exhaust pipe 86 is connected to the exhaust device 87. Operating the exhaust device 87 and opening the exhaust valve 88 exhausts atmosphere from the thermal processing space 65. A vacuum pump or an exhaust utility in the factory where the thermal processing apparatus 1 is placed is applicable as the exhaust device 87.

The thermal processing apparatus 1 includes a susceptor 70 and an up-and-down driving unit 20. The susceptor 70 holds a semiconductor wafer W to be processed placed thereon. The susceptor 70 is a substantially rectangular flat plate member made of quarts. The size of the susceptor 70 in lengthwise and crosswise directions is larger than the diameter of a semiconductor wafer W to be processed (as an example, assuming that the diameter of a semiconductor wafer W is 450 mm, the size of the susceptor 70 in lengthwise and crosswise directions is greater than 450 mm). Meanwhile, the size of the susceptor 70 in a plane is smaller than that of the thermal processing space 65 inside the chamber 6 in a plane, as shown in FIG. 2.

Figure 3:
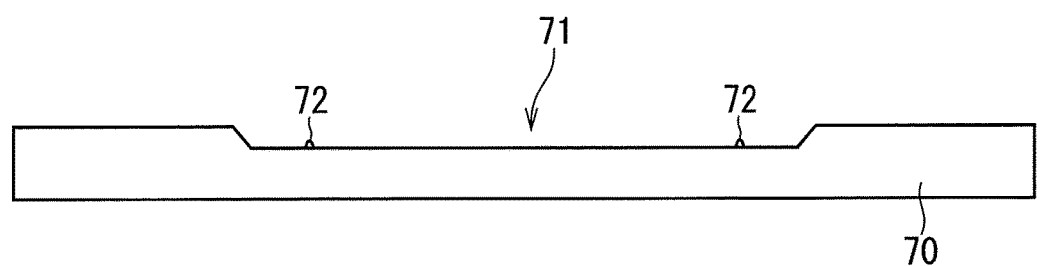
FIG. 3 is a sectional view of a susceptor.

FIG. 3 is a sectional view of the susceptor 70. As shown in FIGS. 2 and 3, a wafer pocket 71 is formed at the center of the upper surface of the susceptor 70. The wafer pocket 71 is a circular recessed part with a diameter slightly larger than that of a semiconductor wafer W. The wafer pocket 71 has a tapered surface at its peripheral area (FIG. 3).

Support pins 72 are provided in upright position on the bottom surface of the wafer pocket 71. In the first preferred embodiment, a total of 12 support pins 72 are provided in upright position at intervals of 30 degrees along the circumference of a circle concentric with the circular wafer pocket 71. The diameter of the circle along which the 12 support pins 72 are arranged (distance between opposite support pins 72) is smaller than the diameter of a semiconductor wafer W. The support pins 72 are each made of quartz. The support pins 72 and the susceptor 70 may be processed integrally. Alternatively, the support pins 72 formed separately may be welded to the susceptor 70.

A semiconductor wafer W is placed on the susceptor 70 while being supported by point contact with the support pins 72 provided in upright position on the wafer pocket 71. The depth of the wafer pocket 71 is greater than the height of the support pins 72. Thus, position shift of the semiconductor wafer W supported with the support pins 72 is prevented by the tapered surface at the peripheral area of the wafer pocket 71.

Eight through holes 73 are formed in the susceptor 70. The through holes 73 are each formed so as to penetrate through the susceptor 70 vertically. Four of the eight through holes 73 are formed in the bottom surface of the wafer pocket 71, and the other four are formed outside the wafer pocket 71. The through holes 73 are holes to let transfer pins 12 of a transfer unit 10 described later pass therethrough.

In the thermal processing apparatus 1 of the present invention, the susceptor 70 is moved up and down by the up-and-down driving unit 20. One up-and-down driving unit 20 is provided on the (−Y) side of the chamber 6, and one up-and-down driving unit 20 is provided on the (+Y) side of the chamber 6. Specifically, in the first preferred embodiment, the two up-and-down driving units 20 move the susceptor 70 up and down while supporting the susceptor 70 at opposite sides.

The up-and-down driving units 20 each include a driving motor 21, a support plate 22, and a support shaft 23. The support plate 22 is a metallic plate, and has a tip end portion fasted to an end portion of the susceptor 70 with a bolt and a nut. The support plate 22 has a lower surface coupled to the support shaft 23. The driving motor 21 moves the support shaft 23 up and down, thereby moving the support plate 22 up and down in the vertical direction (Z-axis direction). The driving motor 21 moves the support shaft 23 up and down by using a mechanism such as a ball screw mechanism according to which the driving motor 21 rotates a ball screw threadedly engaging a member coupled to the lower end of the support shaft 23, for example. It is preferable that the driving motor 21 be a pulse motor capable of controlling positioning precisely. In order to detect the height of the susceptor 70, it is preferable that the driving motor 21 be given an encoder.

As shown in FIG. 1, the up-and-down driving units 20 are each arranged outside the chamber side wall section 61 of the chamber 6, except a part of the tip end of the support plate 22. The support plates 22 are provided so as to pass through opening areas formed on the (−Y) and (+Y) sides of the chamber side wall section 61. In order to maintain the airtightness of the thermal processing space 65, the opposite opening areas of the chamber side wall section 61 the support plates 22 pass through are covered with a casing 24. The up-and-down driving units 20 are housed in the casing 24. As a result, atmosphere outside the thermal processing apparatus 1 and atmosphere of the thermal processing space 65 are isolated. In order to prevent entry of dust particles caused by the up-and-down driving units 20 themselves into the thermal processing space 65, it is preferable that a member such as the support shafts 23 be covered with bellows.

In the first preferred embodiment, the driving motors 21 of the two up-and-down driving units 20 provided on the (−Y) and (+Y) sides of the chamber 6 move the supports plates 22 in a synchronized manner. Thus, the susceptor 70 is moved up and down in the vertical direction in the chamber 6 by the two up-and-down driving units 20 while maintaining a horizontal posture (posture the normal line of which extends in the vertical direction).

Figure 4:
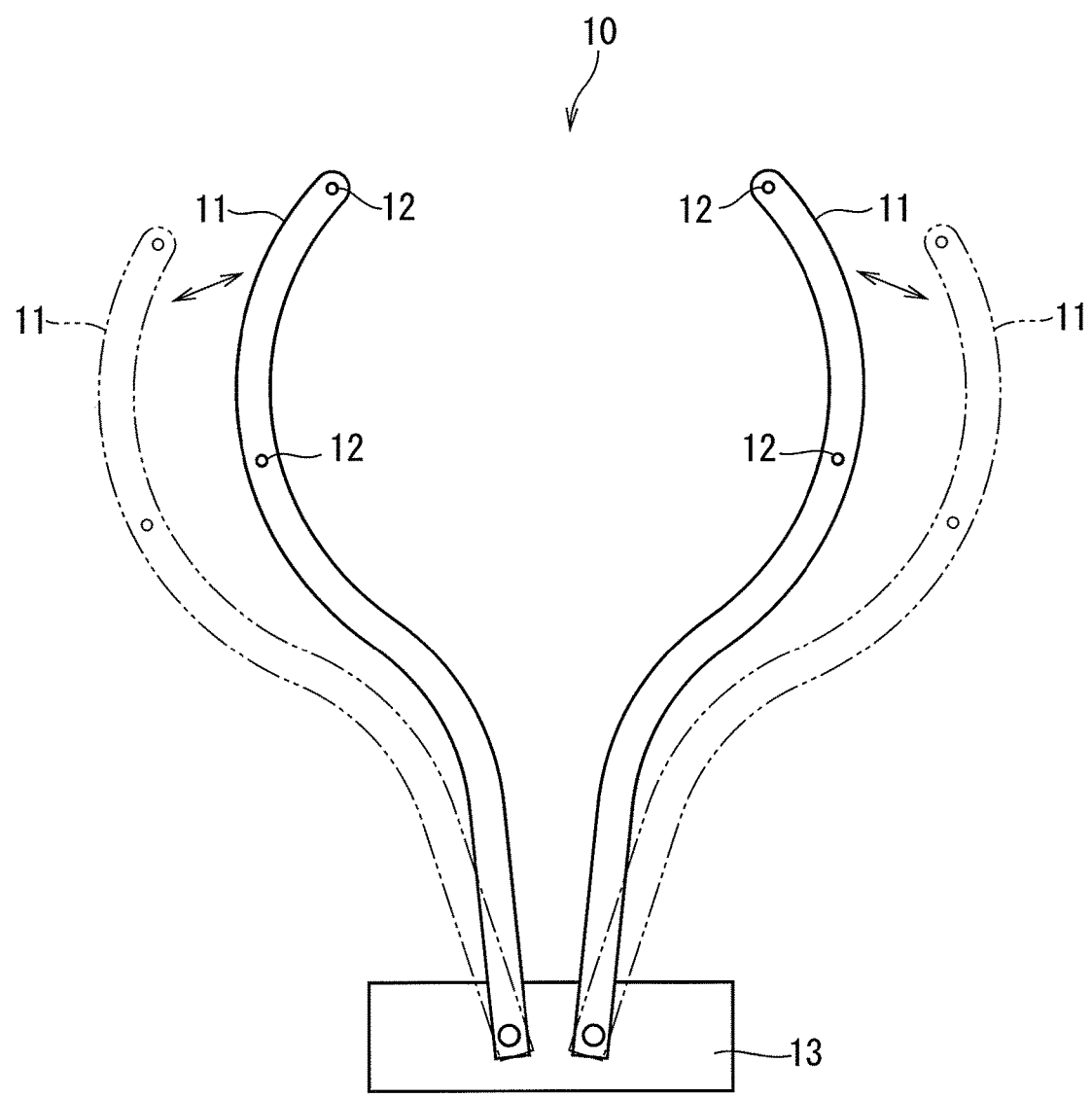
FIG. 4 is a plan view of a transfer unit.

The thermal processing apparatus 1 includes the transfer unit 10 inside the chamber 6 that transfers a semiconductor wafer W to the susceptor 70 and receives a semiconductor wafer W from the susceptor 70. FIG. 4 is a plan view of the transfer unit 10. The transfer unit 10 includes two arms 11. Two transfer pins 12 are provided in upright position on each of the arms 11. Accordingly, the transfer unit 10 includes four transfer pins 12 in total. Each of the arms 11 can be caused to pivot by a horizontal movement mechanism 13. The horizontal movement mechanism 13 moves the arms 11 in a pair horizontally between a transfer operating position (position with solid lines of FIG. 4) where a semiconductor wafer W is transferred to the susceptor 70 and is received from the susceptor 70, and a retracted position (position with alternate long and two short dashed lines of FIG. 4) that does not overlap a semiconductor wafer W held on the susceptor 70 in plan view. The horizontal movement mechanism 13 is provided on the (−X) side of the chamber 6. The horizontal movement mechanism 13 may cause both the arms 11 to pivot by different motors, or may use a linking mechanism to cause the arms 11 in a pair to pivot in an interlocked manner by one motor.

The four transfer pins 12 are moved in the horizontal direction (within the XY plane) by the horizontal movement mechanism 13, whereas they are not moved up and down in the vertical direction. Specifically, the height of the four transfer pins 12 is fixed inside the chamber 6.

If the up-and-down driving units 20 move the susceptor 70 down while the arms 11 in a pair are closed in the transfer operating position, the four transfer pins 12 pass through the through holes 73 in the wafer pocket 71 so that the upper ends of the transfer pins 12 project from the upper surface of the susceptor 70. If a semiconductor wafer W is held in the wafer pocket 71 of the susceptor 70 at this time, the semiconductor wafer W is raised and supported with the four transfer pins 12. If the susceptor 70 moves up while the semiconductor wafer W is supported with the four transfer pins 12 projecting to a position above the upper surface of the susceptor 70, the semiconductor wafer W is then held in the wafer pocket 71. In this way, the semiconductor wafer W is transferred between the four transfer pins 12 and the susceptor 70.

If the up-and-down driving units 20 move the susceptor 70 down while the arms 11 in a pair are open in the retracted position, the four transfer pins 12 pass through the through holes 73 provided outside the wafer pocket 71 so that the upper ends of the transfer pins 12 project from the upper surface of the susceptor 70. In this case, if a semiconductor wafer W is held in the wafer pocket 71, the semiconductor wafer W is kept on the susceptor 70.

Referring back to FIG. 1, the flash heating unit 5 provided above the chamber 6 includes a light source composed of a plurality of (in the first preferred embodiment, 30) xenon flash lamps FL and a reflector 52 provided so as to cover the light source from above. The light source and the reflector 52 are housed in a casing 51. A lamp light radiation window 53 is attached to the bottom of the casing 51 of the flash heating unit 5. The lamp light radiation window 53 forming a floor part of the flash heating unit 5 is a plate-like window made of quartz. Providing the flash heating unit 5 above the chamber 6 makes the lamp light radiation window 53 face the upper chamber window 63. The flash lamps FL irradiate the thermal processing space 65 with flashes traveling from above the chamber 6 to reach the thermal processing space 65 through the lamp light radiation window 53 and the upper chamber window 63.

The flash lamps FL are each a bar-shaped lamp of an elongated cylindrical shape. The flash lamps FL are arranged in a plane such that the longitudinal directions thereof extend parallel to each other in the horizontal direction. Thus, a plane formed by the arrangement of the flash lamps FL becomes a horizontal plane.

The xenon flash lamps FL each include a bar-shaped glass tube (discharge tube) filled with xenon gas inside and having opposite ends with an anode and a cathode connected to a capacitor, and a trigger electrode provided on the outer circumference of the glass tube. Xenon gas is an electrically insulating substance. Hence, even if electric charge is accumulated in the capacitor, electricity does not flow inside the glass tube in a normal condition. Meanwhile, if a high voltage is applied to the trigger electrode to cause electrical breakdown, electricity accumulated in the capacitor flows into the glass tube instantaneously to excite atoms or molecules of xenon, thereby emitting light. In these xenon flash lamps FL, electrostatic energy accumulated in advance in the capacitor is converted to an extremely short light pulse of from 0.1 milliseconds to 100 milliseconds. Thus, the xenon flash lamps FL are characteristically capable of emitting extremely intense light compared to a light source such as the halogen lamps HL that are lighted continuously.

The reflector 52 is provided above the flash lamps FL so as to cover the flash lamps FL entirely. The basic function of the reflector 52 is to reflect flashes emitted from the flash lamps FL toward the thermal processing space 65. The reflector 52 is composed of an aluminum alloy plate, and has a front surface (surface bordering the flash lamps FL) roughened as a result of blasting.

The halogen heating unit 4 provided below the chamber 6 includes a plurality of (in the first preferred embodiment, 40) halogen lamps HL housed in a casing 41. The halogen lamps HL of the halogen heating unit 4 irradiate the thermal processing space 65 with light traveling from below the chamber 6 to reach the thermal processing space 65 through the lower chamber window 64.

FIG. 5 is a plan view showing the arrangement of the halogen lamps HL. In the first preferred embodiment, 20 halogen lamps HL are arranged in each of an upper column and a lower column. The halogen lamps HL are each a bar-shaped lamp of an elongated cylindrical shape. The 20 halogen lamps HL in each of the upper and lower columns are arranged such that the longitudinal directions thereof extend parallel to each other in the horizontal direction. Thus, in each of the upper and lower columns, a plane formed by the arrangement of the halogen lamps HL becomes a horizontal plane.

As shown in FIG. 5, in each of the upper and lower columns, the halogen lamps HL are arranged more densely in a region facing a peripheral area of a semiconductor wafer W held on the susceptor 70 than in a region facing a central area of the semiconductor wafer W. Specifically, in each of the upper and lower columns, the pitch of the halogen lamps HL is shorter in a peripheral area of the lamp arrangement than in a central area thereof. This makes it possible to irradiate the peripheral area of the semiconductor wafer W with more light that is likely to cause temperature drop while being heated by irradiation with light from the halogen heating unit 4.

A lamp group composed of the halogen lamps HL in the upper column and a lamp group composed of the halogen lamps HL in the lower column are arranged so as to cross each other in a grid pattern. Specifically, a total of 40 halogen lamps HL are arranged such that the longitudinal direction of each halogen lamp HL in the upper column and the longitudinal direction of each halogen lamp HL in the lower column become orthogonal to each other.

The halogen lamps HL are each a filament type light source that energizes a filament in a glass tube to make the filament incandescent, thereby emitting light. The glass tube is filled with gas inside containing inert gas such as nitrogen or argon and a halogen element (iodine or bromine, for example) introduced in minute amount into the inert gas. Introducing the halogen element allows the temperature of the filament to be set high while suppressing breakage of the filament. Thus, the halogen lamps HL are longer-life lamps than general incandescent bulbs, and are characteristically capable of emitting intense light continuously compared to general incandescent bulbs. The halogen lamps HL are long-life lamps for their bar shapes, and irradiate a semiconductor wafer W above the halogen lamps HL with excellent efficiency as a result of arrangement of the halogen lamps HL in the horizontal direction.

The controller 3 controls the various operating mechanisms described above in the thermal processing apparatus 1. The hardware structure of the controller 3 is the same as that of a generally used computer. Specifically, the controller 3 includes a CPU responsible for various arithmetic operations, a ROM that is a read-only memory storing a basic program, a RAM that is a freely readable and writable memory storing various information, and a magnetic disk storing control software, data and the like. Execution of a certain processing program by the CPU of the controller 3 makes the controller 3 realize process in the thermal processing apparatus 1.

In addition to the aforementioned structures, the thermal processing apparatus 1 includes various cooling structures intended to prevent excessive temperature increase of the halogen heating unit 4, the flash heating unit 5 and the chamber 6 to be caused by heat energy generated from the halogen lamps HL and the flash lamps FL during thermal process on a semiconductor wafer W. By way of example, the chamber side wall section 61 is provided with a water-cooled tube (not shown in the drawings). The halogen heating unit 4 and the flash heating unit 5 are each configured as an air-cooled structure where heat is exhausted by a gas flow formed inside the structure. Further, air is supplied into a gap between the upper chamber window 63 and the lamp light radiation window 53 to cool the flash heating unit 5 and the upper chamber window 63. Additionally, the chamber 6 is provided with a temperature sensor (such as a radiation thermometer to measure temperature in a non-contact manner) that measures the temperature of a semiconductor wafer W held on the susceptor 70.

Procedure of process on a semiconductor wafer W in the thermal processing apparatus 1 is described next. A semiconductor wafer W to be processed is a semiconductor substrate containing impurities (impurity ions) implanted by ion implantation process. These impurities are activated by heating process by irradiation with a flash (annealing) performed by the thermal processing apparatus 1. The procedure descried below taken by the thermal processing apparatus 1 proceeds while the controller 3 controls each operating mechanism in the thermal processing apparatus 1.

Figure 6:
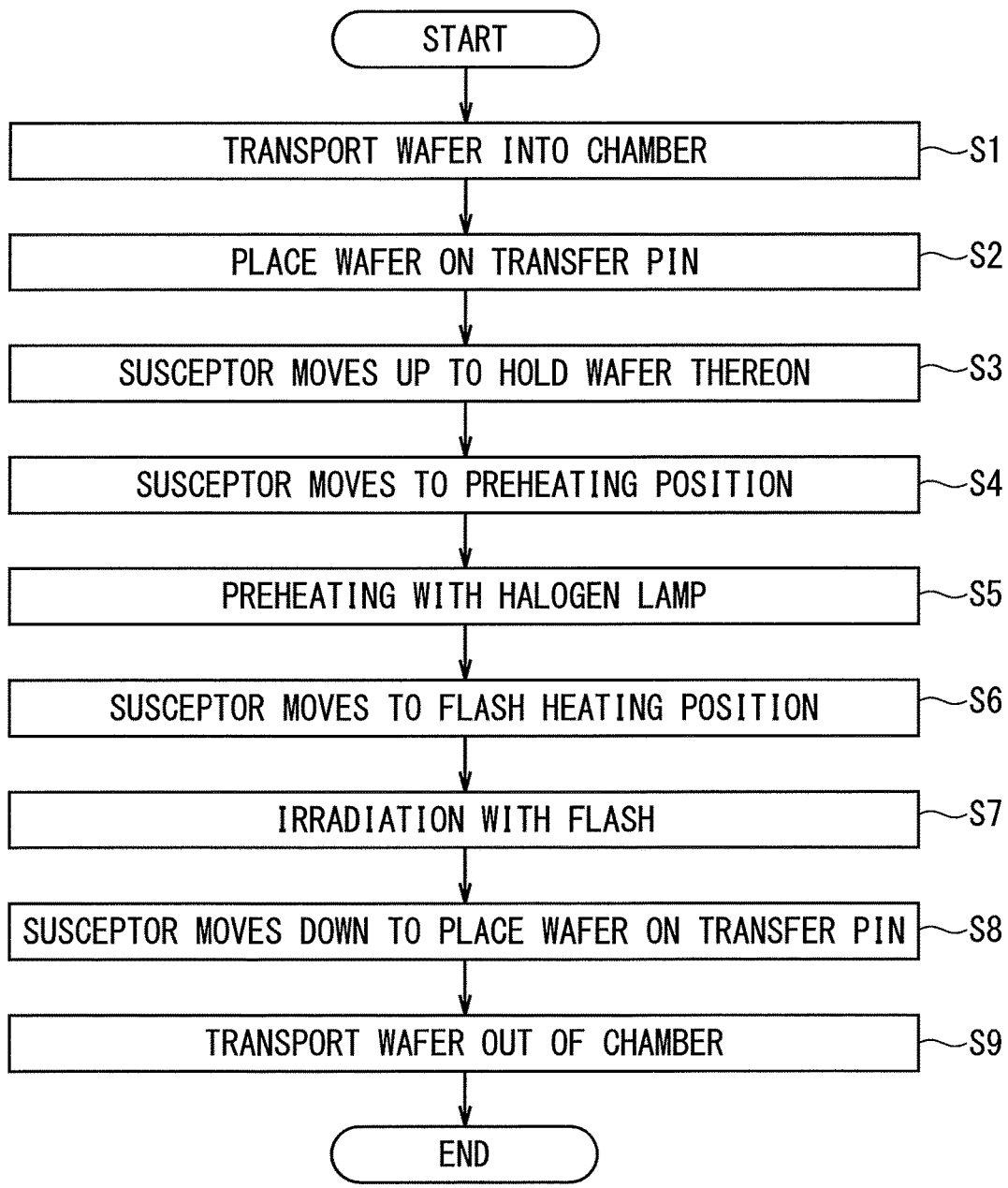
FIG. 6 is a flowchart showing the procedure of process on a semiconductor wafer in the thermal processing apparatus of FIG. 1.

FIG. 6 is a flowchart showing the procedure of process on a semiconductor wafer W in the thermal processing apparatus 1. FIGS. 7 to 10 each schematically show a condition made by one of the steps of FIG. 6.

First, the transport opening section 66 is opened and an ion-implanted semiconductor wafer W is transported through the transport opening section 66 into the thermal processing space 65 inside the chamber 6 by a transport robot placed outside the apparatus (step S1). At this time, the arms 11 in a pair of the transfer unit 10 are placed at the transfer operating position. Further, the susceptor 70 has moved down and the four transfer pins 12 pass through the through holes 73 in the wafer pocket 71 so that the upper ends of the transfer pins 12 project from the upper surface of the susceptor 70.

Figure 7:
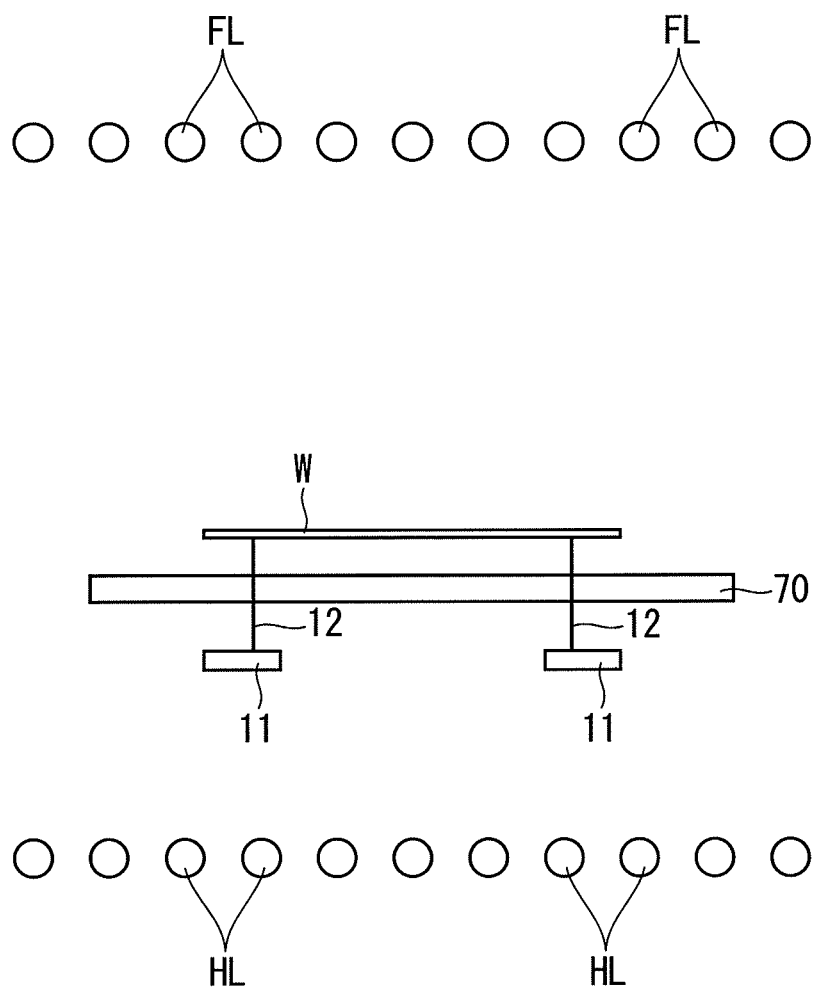
FIG. 7 shows a condition where a semiconductor wafer is placed on transfer pins.

The semiconductor wafer W having been transported into the thermal processing space 65 by the transport robot goes forward to a position directly above the wafer pocket 71 of the susceptor 70 and stops there. Then, the transport robot moves down to transfer the semiconductor wafer W from the transport robot to the four transfer pins 12, so that the semiconductor wafer W is placed on the transfer pins 12 (step S2). FIG. 7 shows a condition where the semiconductor wafer W is placed on the transfer pins 12. At this time, the susceptor 70 is located at a height between the height of the semiconductor wafer W placed on the transfer pins 12 and that of the arms 11.

After the semiconductor wafer W is placed on the transfer pins 12, the transport robot exists the thermal processing space 65 and the transport opening section 66 is closed by the gate valve. Then, the up-and-down driving units 20 move the susceptor 70 up to a position above the transfer pins 12, thereby transferring the semiconductor wafer W from the transfer pins 12 onto the susceptor 70 (step S3). The susceptor 70 holds the semiconductor wafer W in the wafer pocket 71 having been received from the transfer pins 12. The semiconductor wafer W is held on the susceptor 70 while a patterned front surface with implanted impurities is placed as an upper surface.

Figure 8:
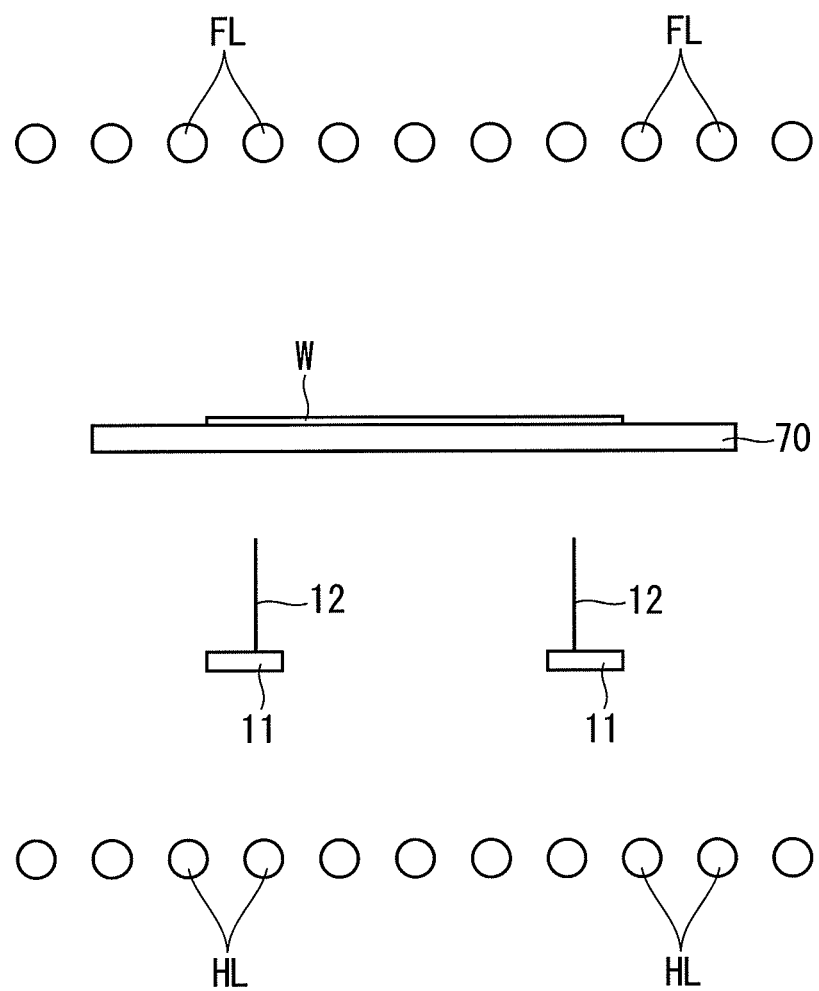
FIG. 8 shows a condition where a semiconductor wafer is received by the susceptor from the transfer pins.

FIG. 8 shows a condition where the semiconductor wafer W is received by the susceptor 70 from the transfer pins 12. After the semiconductor wafer W is transferred to the susceptor 70, the horizontal movement mechanism 13 moves the arms 11 in a pair to the retracted position. Further, the gas supply unit 80 and the exhaust unit 85 replace atmosphere in the chamber 6. The supply valve 83 of the gas supply unit 80 is opened to supply nitrogen gas into the thermal processing space 65 inside the chamber 6. Further, the exhaust valve 88 is opened while the exhaust device 87 of the exhaust unit 85 is operated, thereby exhausting gas from the chamber 6. As a result, atmosphere in the thermal processing space 65 inside the chamber 6 is replaced from air atmosphere to nitrogen atmosphere. In order to control flow of external atmosphere into the chamber 6 to a minimum resulting from transportation of the semiconductor wafer W into the chamber 6, supply of nitrogen gas into the chamber 6 may be started before the transport opening section 66 is opened.

Figure 9:
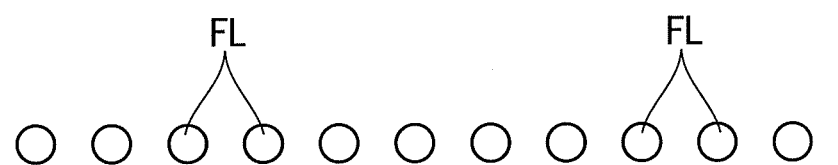
FIG. 9 shows a condition where the susceptor has moved to a preheating position.
Figure 9:
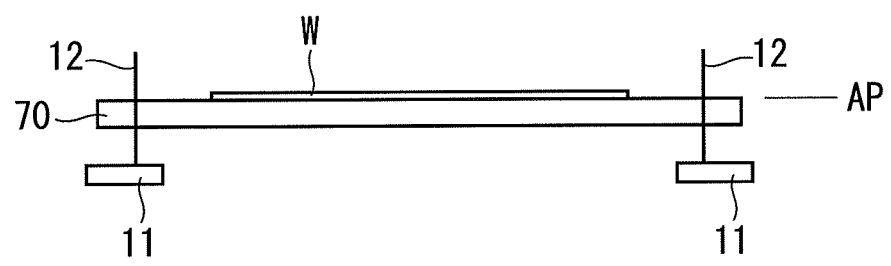
Figure 9:
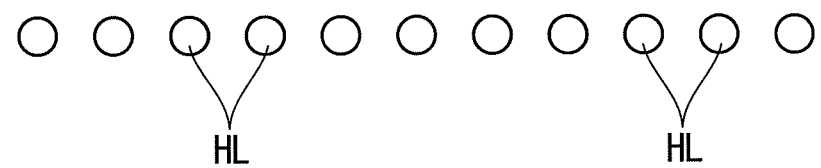

Next, the controller 3 controls the up-and-down driving units 20 to move the susceptor 70 to a preheating position (first position) (step S4). FIG. 9 shows a condition where the susceptor 70 has moved to a preheating position AP. The preheating position AP is a height of the susceptor 70 that achieves the most uniform in-plane illumination distribution of light emitted from the halogen lamps HL and applied to a back surface (main surface opposite the front surface) of the semiconductor wafer W held on the susceptor 70. A height optimum for heating with the halogen lamps HL is determined in advance by experiment or simulation, and is stored as the preheating position AP into a storage of the controller 3. The controller 3 controls the up-and-down driving units 20 to move the susceptor 70 holding the semiconductor wafer W to the preheating position AP. Or, the preheating position AP may be designated in a recipe reciting the operating procedure, processing conditions and the like of the thermal processing apparatus 1.

The preheating position AP may be below the height of the susceptor 70 (height of FIG. 7) where the semiconductor wafer W is transferred from the transport robot to the transfer pins 12. In the first preferred embodiment, after receiving the semiconductor wafer W, the susceptor 70 moves down to a position below the upper ends of the transfer pins 12 to reach the preheating position AP. The arms in a pair 1 have moved to the retracted position after the susceptor 70 receives the semiconductor wafer W. Thus, at this time, the four transfer pins 12 pass through the through holes 73 provided outside the wafer pocket 71. As a result, while the transfer pins 12 project to a position above the upper surface of the susceptor 70 when the susceptor 70 moves to the preheating position AP, these transfer pins 12 do not raise the semiconductor wafer W so that the semiconductor wafer W is kept on the susceptor 70.

After the susceptor 70 holding the semiconductor wafer W reaches the preheating position AP and stops there, the 40 halogen lamps HL of the halogen heating unit 4 turn on in unison to start preheating (assisted heating) (step S5). Halogen light emitted from the halogen lamps HL passes through the lower chamber window 64 and the susceptor 70 to be applied to the semiconductor wafer W from the back surface thereof. By being irradiated with the light from the halogen lamps HL, the semiconductor wafer W is preheated to increase in temperature. The arms 11 in a pair of the transfer unit 10 have moved to the retracted position that does not overlap the semiconductor wafer W, so that the arms 11 do not become an obstacle to the preheating with the halogen lamps HL.

During the preheating with the halogen lamps HL, the temperature of the semiconductor wafer W is measured with the temperature sensor not shown in the drawings. The measured temperature of the semiconductor wafer W is transmitted to the controller 3. The controller 3 monitors the temperature of the semiconductor wafer W to increase in response to irradiation with light from the halogen lamps HL to see if this temperature has reached a given preheating temperature T1. The preheating temperature T1 is set from about 200° C. to about 800° C. and more preferably, from about 350° C. to about 600° C. (in the first preferred embodiment, 600° C.) that can prevent diffusion by heat of the impurities added to the semiconductor wafer W.

After the temperature of the semiconductor wafer W reaches the preheating temperature T1, the controller 3 maintains the semiconductor wafer W at the preheating temperature T1 for a while. More specifically, when the temperature of the semiconductor wafer W measured with the temperature sensor reaches the preheating temperature T1, the controller 3 controls output of the halogen lamps HL to maintain the semiconductor wafer W at substantially the preheating temperature T1.

The aforementioned preheating with the halogen lamps HL increases the temperature of the entire semiconductor wafer W uniformly to the preheating temperature T1. In the stage of the preheating with the halogen lamps HL, temperature of the semiconductor wafer W is more likely to drop in a peripheral area than in a central area as heat escapes more easily in the peripheral area than in the central area. Meanwhile, the halogen lamps HL of the halogen heating unit 4 are arranged more densely in a region facing the peripheral area of the semiconductor wafer W than in a region facing the central area of the semiconductor wafer W. Thus, the peripheral area of the semiconductor wafer W where heat escapes easily is irradiated with more light, so that an in-plane temperature distribution of the semiconductor wafer W can be uniform in the preheating stage.

In particular, in the first preferred embodiment, the preheating is performed in a condition where the susceptor 70 has moved to the preheating position AP that achieves the most uniform in-plane illumination distribution of light emitted from the halogen lamps HL and applied to the semiconductor wafer W. Thus, the preheating is performed at the optimum height, thereby achieving favorable uniformity of an in-plane temperature distribution of the semiconductor wafer W in the preheating stage.

Figure 10:
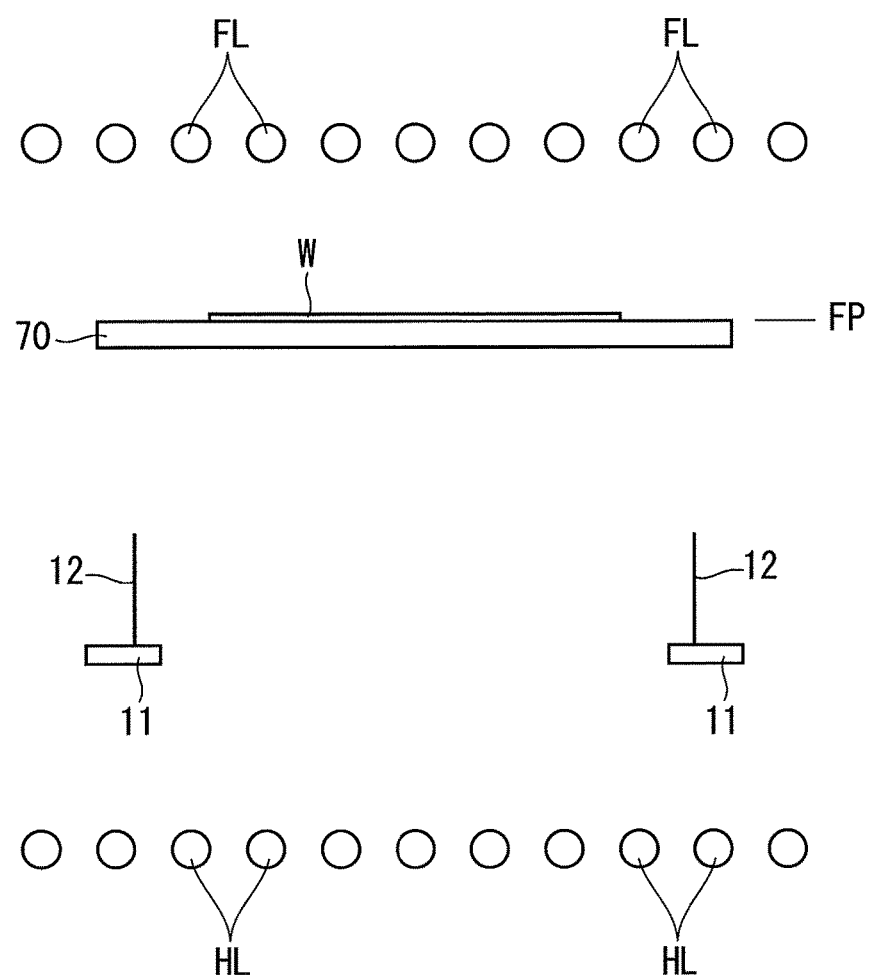
FIG. 10 shows a condition where the susceptor has moved to a flash heating position.

When a predetermined time has elapsed after the temperature of the semiconductor wafer W reaches the preheating temperature T1, the controller 3 controls the up-and-down driving units 20 to move the susceptor 70 to a flash heating position (second position) (step S6). FIG. 10 shows a condition where the susceptor 70 has moved to a flash heating position FP. The flash heating position FP is a height of the susceptor 70 that achieves the most uniform in-plane illumination distribution of flashes emitted from the flash lamps FL and applied to the front surface of the semiconductor wafer W held on the susceptor 70. Like the aforementioned case of the preheating position AP, a height optimum for flash heating with the flash lamps FL is determined in advance by experiment or simulation, and is stored as the flash heating position FP into the storage of the controller 3. The controller 3 controls the up-and-down driving units 20 to move the susceptor 70 holding the semiconductor wafer W to the flash heating position FP. Or, the flash heating position FP may be designated in a recipe. In the first preferred embodiment, the flash heating position FP is above the preheating position AP. After the preheating is finished, the susceptor 70 moves up to reach the flash heating position FP.

After the susceptor 70 holding the semiconductor wafer W reaches the flash heating position FP and stops there, the flash lamps FL of the flash heating unit 5 irradiate the front surface of the semiconductor wafer W with flashes (step S7). At this time, some of the flashes from the flash lamps FL travel toward the inside of the chamber 6 directly, whereas the other flashes are reflected once by the reflector 52 and then travel toward the inside of the chamber 6. The semiconductor wafer W is flash heated by being irradiated with these flashes.

The flash heating is performed by irradiation with flashes (bursts of light) from the flash lamps FL, so that the temperature of the front surface of the semiconductor wafer W can be increased in a short time. Specifically, flashes emitted from the flash lamps FL are extremely short and intense bursts of light of extremely short light pulses converted from electrostatic energy accumulated in advance in the capacitor to be applied in a time of from 0.1 milliseconds to 100 milliseconds. The temperature of the front surface of the semiconductor wafer W flash heated by being irradiated with flashes from the flash lamps FL increases instantaneously as high as to a processing temperature T2 of 1000° C. or more to activate the impurities implanted in the semiconductor wafer W. Then, the temperature of the front surface drops rapidly. In this way, the thermal processing apparatus 1 can increase and decrease the temperature of the front surface of the semiconductor wafer W within an extremely short time. This allows activation of the impurities implanted in the semiconductor wafer W while suppressing diffusion of the impurities by heat. A time required for activation of the impurities is extremely shorter than a time required for diffusion of the impurities by heat. Thus, the activation is completed even in a short time of from 0.1 milliseconds to 100 milliseconds that does not cause diffusion of the impurities.

In the first preferred embodiment, the flash heating is performed in a condition where the susceptor 70 has moved to the flash heating position FP that achieves the most uniform in-plane illumination distribution of flashes emitted from the flash lamps FL and applied to the semiconductor wafer W. Thus, the flash heating is performed at the optimum height, thereby achieving favorable uniformity of an in-plane temperature distribution of the semiconductor wafer W during the flash heating.

After a predetermined time has elapsed after the flash heating process is finished, the halogen lamps HL turn off. As a result, the temperature of the semiconductor wafer W drops rapidly from the preheating temperature T1. The horizontal movement mechanism 13 moves the arms 11 in a pair from the retracted position to the transfer operating position, and the susceptor 70 moves down. The susceptor 70 moves down to the height thereof (height of FIG. 7) where the semiconductor wafer W is transferred from the transport robot to the transfer pins 12. The susceptor 70 moves down while the arms 11 in a pair are in the transfer operating position, so that the four transfer pins 12 pass through the through holes 73 provided in the wafer pocket 71. As a result, the semiconductor wafer W having been supported on the susceptor 70 is raised and supported with the four transfer pins 12 at a position above the susceptor 70 (step S8). This condition is the same as that of FIG. 7.

After the temperature of the semiconductor wafer W drops to a predetermined temperature or below, the transport opening section 66 of the chamber 6 is opened and the semiconductor wafer W on the transfer pins 12 is transported out of the chamber 6 by the transport robot placed outside the apparatus. Then, the heating process on the semiconductor wafer W is completed in the thermal processing apparatus 1 (step S9).

In the first preferred embodiment, the susceptor 70 holding a semiconductor wafer W is capable of moving up and down. The susceptor 70 moves to the preheating position AP for preheating with the halogen lamps HL. The preheating position AP is a height of the susceptor 70 that achieves the most uniform in-plane illumination distribution of light emitted from the halogen lamps HL and applied to the back surface of the semiconductor wafer W held on the susceptor 70. Thus, the preheating is performed at the optimum height, thereby achieving favorable uniformity of an in-plane temperature distribution of the semiconductor wafer W in the preheating stage.

After the preheating is finished, the susceptor 70 moves to the flash heating position FP for irradiation with flashes from the flash lamps FL. The flash heating position FP is a height of the susceptor 70 that achieves the most uniform in-plane illumination distribution of flashes emitted from the flash lamps FL and applied to the front surface of the semiconductor wafer W held on the susceptor 70. Thus, the flash heating is performed at the optimum height, thereby achieving favorable uniformity of an in-plane temperature distribution of the semiconductor wafer W during irradiation with flashes.

As a result, a uniform in-plane temperature distribution of the semiconductor wafer W is achieved during both irradiation of light from the flash lamps FL and irradiation of light from the halogen lamps HL, thereby achieving an extremely favorable result of the thermal process.

In the first preferred embodiment, the four transfer pins 12 of the transfer unit 10 are moved in the horizontal direction by the horizontal movement mechanism 13 but it is not moved up and down in the vertical direction, so that the height of the transfer pins 12 is fixed. Thus, there is no need for preparing space for vertical movement of the transfer pins 12 inside the chamber 6. This allows reduction of a volume inside the chamber 6, compared to a conventional flash lamp annealing apparatus such as that of US 2009/0175605. As a result, the amount of required processing gas (in the first preferred embodiment, nitrogen gas) to be consumed during replacement of atmosphere inside the chamber 6 can be reduced, so that the atmosphere is replaced with enhanced efficiency.

Further, in the first preferred embodiment, for transfer and receipt of a semiconductor wafer W, the transport robot placed outside the apparatus moves up and down relative to the four transfer pins 12 of the transfer unit 10 not to move up and down. Generally, a transport robot designed specifically for transportation of a wafer moves at high speed. Thus, the semiconductor wafer W can be transferred between the transport robot and the four transfer pins 12 in a shorter time by the vertical movement of the transport robot than by the vertical movement of the transfer pins 12. This shortens a time required for transfer and receipt of the semiconductor wafer W, thereby increasing the throughput of the thermal processing apparatus 1.

Second Preferred Embodiment

A second preferred embodiment of the present invention is described next. The structure of a thermal processing apparatus of the second preferred embodiment is exactly the same as that of the thermal processing apparatus 1 of the first preferred embodiment. Procedure of process on a semiconductor wafer W in the thermal processing apparatus 1 of the second preferred embodiment is substantially the same as that of the first preferred embodiment (FIG. 6). The second preferred embodiment differs from the first preferred embodiment in that the susceptor 70 is shaken up and down during preheating with the halogen lamps HL.

In the second preferred embodiment, process on a semiconductor wafer W follows exactly the same as steps S1 to S4 of FIG. 6 in the first preferred embodiment. Specifically, after the semiconductor wafer W transported into the chamber 6 by a transport robot outside the apparatus is placed on the four transfer pins 12 of the transfer unit 10, the susceptor 70 moves up to receive the semiconductor wafer W and hold the semiconductor wafer W thereon. Next, the arms 11 in a pair move to the retracted position and the susceptor 70 moves to the preheating position AP.

Figure 11:
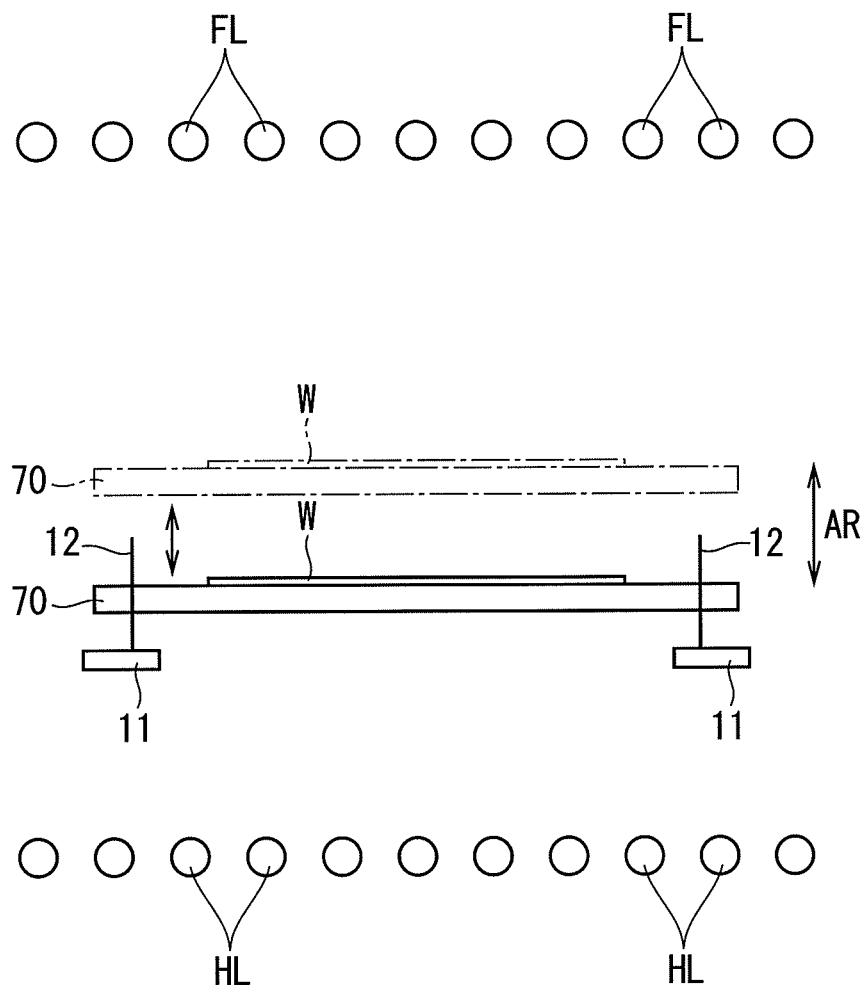
FIG. 11 shows a condition where the susceptor moves up and down during preheating.

A next step is preheating with the 40 halogen lamps HL of the halogen heating unit 4. At this time, in the second preferred embodiment, the controller 3 controls the up-and-down driving units 20 to move the susceptor 70 back and forth in the vertical direction. FIG. 11 shows a condition where the susceptor 70 moves up and down during preheating. For preheating with the halogen lamps HL, the controller 3 controls the up-and-down driving units 20 to move the susceptor 70 back and forth in a certain preheating moving range AR. The preheating moving range AR covers the preheating position AP. As an example, the preheating moving range AR may be a range spaced upwardly and downwardly by a certain distance from the preheating position AP (in this case, the preheating position AP becomes the center of the preheating moving range AR).

The preheating position AP is a height of the susceptor 70 that achieves the most uniform in-plane illumination distribution of light emitted from the halogen lamps HL and applied to the back surface of the semiconductor wafer W held on the susceptor 70. However, it is still difficult to achieve a completely uniform in-plane illumination distribution. In the second preferred embodiment, the susceptor 70 moves back and forth within the preheating moving range AR during preheating with the halogen lamps HL, so that slight nonuniformity of an in-plane illumination distribution of halogen light occurring at the back surface of the semiconductor wafer W can be dispersed. Specifically, if illumination becomes lower in some area than in other area of the back surface of the semiconductor wafer W while the susceptor 70 is at some height within the preheating moving range AR, the back-and-forth movement of the susceptor 70 within the preheating moving range AR moves the low-illumination area in the plane of the semiconductor wafer W. This prevents illumination shortage only at a specific place, thereby achieving more favorable uniformity of an in-plane temperature distribution of the semiconductor wafer W in the preheating stage.

Steps to be performed after the preheating with the halogen lamps HL is finished are exactly the same as steps S6 to S9 of FIG. 6 in the first preferred embodiment. Specifically, the susceptor 70 holding the preheated semiconductor wafer W moves to the flash heating position FP and the semiconductor wafer W is irradiated with flashes from the flash lamps FL. Next, the susceptor 70 moves down to transfer the semiconductor wafer W to the transfer pins 12. Then, the transport robot outside the apparatus transports the processed semiconductor wafer W out of the chamber 6, thereby completing the heating process on the semiconductor wafer W.

Third Preferred Embodiment

A third preferred embodiment of the present invention is described next. The structure of a thermal processing apparatus of the third preferred embodiment is substantially the same as that of the thermal processing apparatus 1 of the first preferred embodiment (FIG. 1). In the third preferred embodiment, the up-and-down driving units 20 each include a tilting mechanism that tilts the susceptor 70 relative to a horizontal plane.

Figure 12:
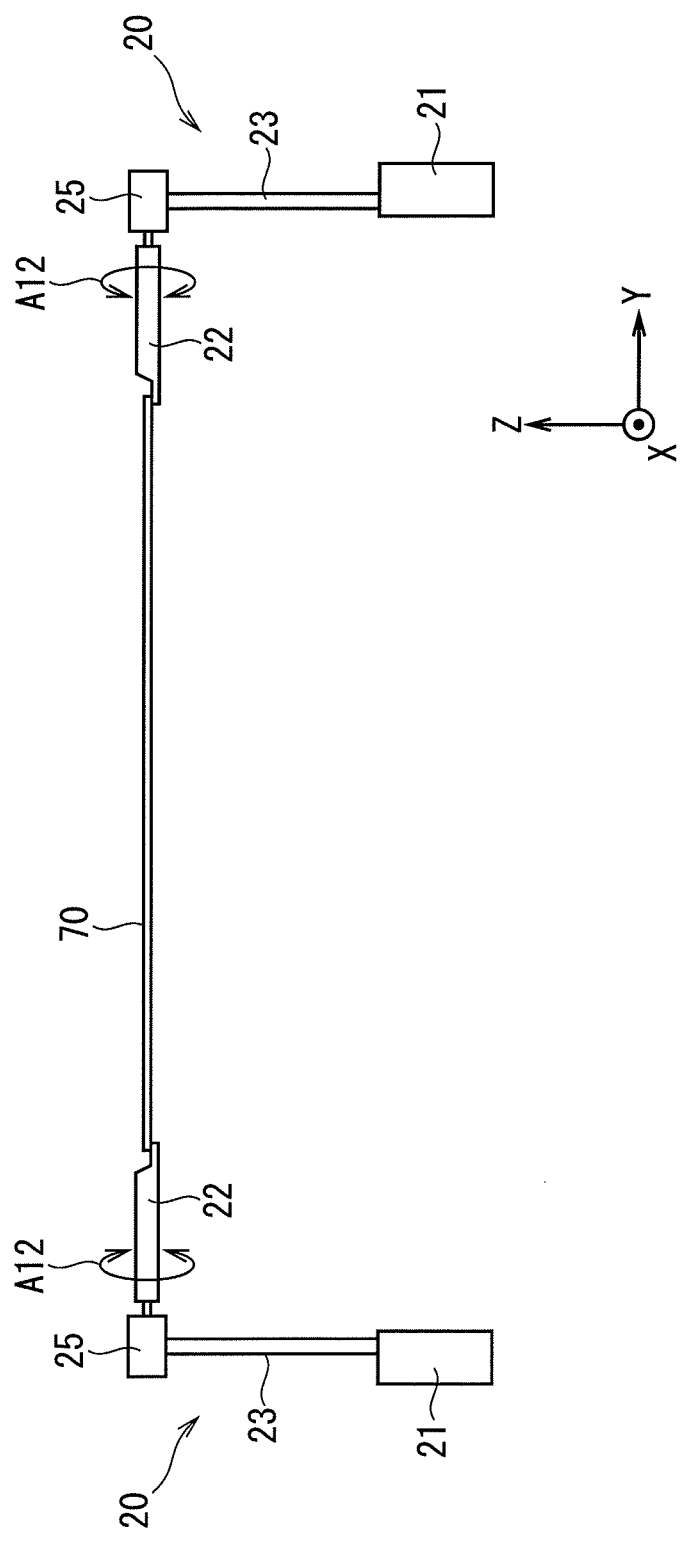
FIG. 12 shows an up-and-down driving unit with a tilting mechanism.

FIG. 12 shows the up-and-down driving unit 20 with the tilting mechanism. In FIG. 12, the same elements as those of the first preferred embodiment are identified by the same reference numbers. The two up-and-down driving units 20 of the third preferred embodiment each further include a tilting motor 25. The tilting motor 25 is coupled to the upper end of the support shaft 23 moved up and down by the driving motor 21. The support plate 22 is coupled to a motor shaft of the tilting motor 25. As shown by arrows A12 of FIG. 12, the tilting motor 25 can tilt the support plate 22 and the susceptor 70 relative to a horizontal plane (XY plane) by rotating the support plate 22 and the susceptor 70 about the Y axis. The two tilting motors 25 (the tilting motor 25 provided to the up-and-down driving unit 20 on the (−Y) side and the tilting motor 25 provided to the up-and-down driving unit 20 on the (+Y) side) operate in a completely synchronized manner, so that they certainly tilt the susceptor 70 to the same angle to coincide with the same timing.

Except for the tilting mechanism provided to each of the up-and-down driving unit 20, the structure of the third preferred embodiment is the same as that of the first preferred embodiment. Procedure of process on a semiconductor wafer W of the third preferred embodiment is substantially the same as that of the first preferred embodiment (FIG. 6). In the third preferred embodiment, process on a semiconductor wafer W follows exactly the same as steps S1 to S4 of FIG. 6 in the first preferred embodiment. Specifically, after the semiconductor wafer W transported into the chamber 6 by a transport robot outside the apparatus is placed on the four transfer pins 12 of the transfer unit 10, the susceptor 70 moves up to receive the semiconductor wafer W and hold the semiconductor wafer W thereon. Next, the arms 11 in a pair move to the retracted position and the susceptor 70 moves to the preheating position AP.

A next step is preheating with the 40 halogen lamps HL of the halogen heating unit 4. At this time, in the third preferred embodiment, the controller 3 controls the tilting motors 25 of the up-and-down driving units 20 to tilt the susceptor 70 relative to a horizontal plane. At this time, the susceptor 70 is tilted to an angle properly determined within a range that allows the wafer pocket 71 to hold the semiconductor wafer W therein.

In the third preferred embodiment, the susceptor 70 holding the semiconductor wafer W is tilted relative to a horizontal plane during preheating with the halogen lamps HL. Thus, even if slight nonuniformity of an in-plane illumination distribution of halogen light occurs at the back surface of the semiconductor wafer W at the preheating position AP, this illumination distribution can be changed to a more uniform distribution. This achieves more favorable uniformity of an in-plane temperature distribution of the semiconductor wafer W in the preheating stage.

During the preheating with the halogen lamps HL, while the susceptor 70 is tilted relative to a horizontal plane, the susceptor 70 may be moved back and forth within the preheating moving range AR, as in the second preferred embodiment. During the preheating with the halogen lamps HL, the susceptor 70 may also be rotated repeatedly within a certain angular range.

Steps to be performed after the preheating with the halogen lamps HL is finished are exactly the same as steps S6 to S9 of FIG. 6 in the first preferred embodiment. Specifically, the susceptor 70 holding the preheated semiconductor wafer W moves to the flash heating position FP and the semiconductor wafer W is irradiated with flashes from the flash lamps FL. Next, the susceptor 70 moves down to transfer the semiconductor wafer W to the transfer pins 12. Then, the transport robot outside the apparatus transports the processed semiconductor wafer W out of the chamber 6, thereby completing the heating process on the semiconductor wafer W.

Fourth Preferred Embodiment

A fourth preferred embodiment of the present invention is described next. The structure of a thermal processing apparatus of the fourth preferred embodiment is substantially the same as that of the thermal processing apparatus 1 of the first preferred embodiment (FIG. 1). In the fourth preferred embodiment, the up-and-down driving units 20 each include a rotating mechanism that rotates the susceptor 70 in a horizontal plane.

Figure 13:
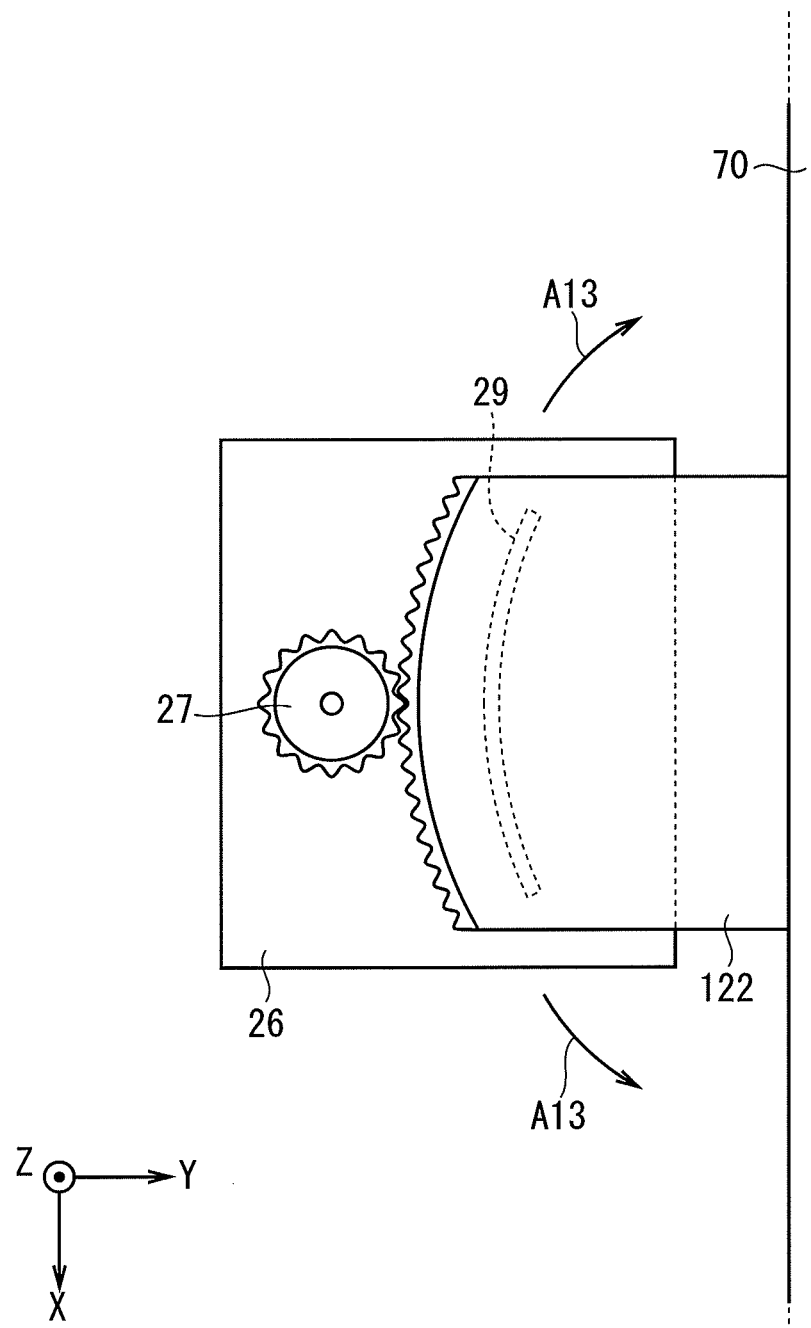
FIG. 13 shows an up-and-down driving unit with a rotating mechanism.

FIG. 13 shows the up-and-down driving unit 20 with the rotating mechanism. The two up-and-down driving units 20 of the fourth preferred embodiment each further include a rotating unit 26. FIG. 13 shows the up-and-down driving unit 20 on the (−Y) side. The up-and-down driving unit 20 on the (+Y) side has the same structure. The rotating unit 26 is coupled to the upper end of the support shaft 23 moved up and down by the driving motor 21. A gear 27 is provided on the upper surface of the box-like rotating unit 26. The gear 27 is rotationally driven in a horizontal plane by a motor built in the rotating unit 26.

An arcuate sliding slot 29 is formed in the upper surface of the rotating unit 26. An engaging member (not shown in the drawings) of a support plate 122 slidably engages the sliding slot 29. As in the first preferred embodiment, a tip end portion of the support plate 122 is fasted to an end portion of the susceptor 70. A base end portion of the support plate 122 is provided with teeth formed by gear cutting process. The teeth in the support plate 122 forms meshing engagement with the gear 27.

Rotating the gear 27 by the rotating unit 26 guides the support plate 122 in meshing engagement with the gear 27 along the sliding slot 29, thereby moving the support plate 122 in a circular pattern in a horizontal plane as shown by arrows A13. The rotating units 26 of the two up-and-down driving units 20 move the respective support plates 122 in a completely synchronized manner to the same angle to coincide with the same timing. The two rotating units 26 move the support plates 122 to the same direction. As an example, if the rotating unit 26 provided to the up-and-down driving unit 20 on the (−Y) side moves the support plate 122 in the clockwise direction in the plane of FIG. 13, the rotating unit 26 provided to the up-and-down driving unit 20 on the (+Y) side also moves the support plate 122 in the clockwise direction in the plane of FIG. 13. As a result, the rotating units 26 of the two up-and-down driving units 20 rotate the susceptor 70 in a horizontal plane (XY plane) about an axis passing through the center of the wafer pocket 71 in the vertical direction.

Except for the rotating mechanism provided to each up-and-down driving unit 20, the structure of the fourth preferred embodiment is the same as that of the first preferred embodiment. Procedure of process on a semiconductor wafer W of the fourth preferred embodiment is substantially the same as that of the first preferred embodiment (FIG. 6). In the fourth preferred embodiment, process on a semiconductor wafer W follows exactly the same as steps S1 to S4 of FIG. 6 in the first preferred embodiment. Specifically, after the semiconductor wafer W transported into the chamber 6 by a transport robot outside the apparatus is placed on the four transfer pins 12 of the transfer unit 10, the susceptor 70 moves up to receive the semiconductor wafer W and hold the semiconductor wafer W thereon. Next, the arms 11 in a pair move to the retracted position and the susceptor 70 moves to the preheating position AP.

A next step is preheating with the 40 halogen lamps HL of the halogen heating unit 4. At this time, in the fourth preferred embodiment, the controller 3 controls the rotating units 26 of the up-and-down driving units 20 to rotate the susceptor 70 in a horizontal plane. At this time, the susceptor 70 is rotated to an angle properly determined allows the susceptor 70 to rotate inside the chamber 6.

In the fourth preferred embodiment, the susceptor 70 holding the semiconductor wafer W is rotated in a horizontal plane during preheating with the halogen lamps HL. Thus, even if slight nonuniformity of an in-plane illumination distribution of halogen light occurs at the back surface of the semiconductor wafer W at the preheating position AP, this illumination distribution can be changed to a more uniform distribution. This achieves more favorable uniformity of an in-plane temperature distribution of the semiconductor wafer W in the preheating stage.

While the susceptor 70 is rotated, the susceptor 70 may be moved back and forth within the preheating moving range AR as in the second preferred embodiment and/or the susceptor 70 may be tilted relative to a horizontal plane as in the third preferred embodiment. During the preheating with the halogen lamps HL, the susceptor 70 may also be rotated repeatedly so as to move back and forth within a certain angular range.

Steps to be performed after the preheating with the halogen lamps HL is finished are exactly the same as steps S6 to S9 of FIG. 6 in the first preferred embodiment. Specifically, the susceptor 70 holding the preheated semiconductor wafer W moves to the flash heating position FP and the semiconductor wafer W is irradiated with flashes from the flash lamps FL. Next, the susceptor 70 moves down to transfer the semiconductor wafer W to the transfer pins 12. Then, the transport robot outside the apparatus transports the processed semiconductor wafer W out of the chamber 6, thereby completing the heating process on the semiconductor wafer W.

Fifth Preferred Embodiment

A fifth preferred embodiment of the present invention is described next. The structure of a thermal processing apparatus of the fifth preferred embodiment is substantially the same as that of the thermal processing apparatus 1 of the first preferred embodiment (FIG. 1). In the fifth preferred embodiment, a buffering mechanism is provided that absorbs an impact on the susceptor 70 to be given during irradiation with flashes.

Figure 14:
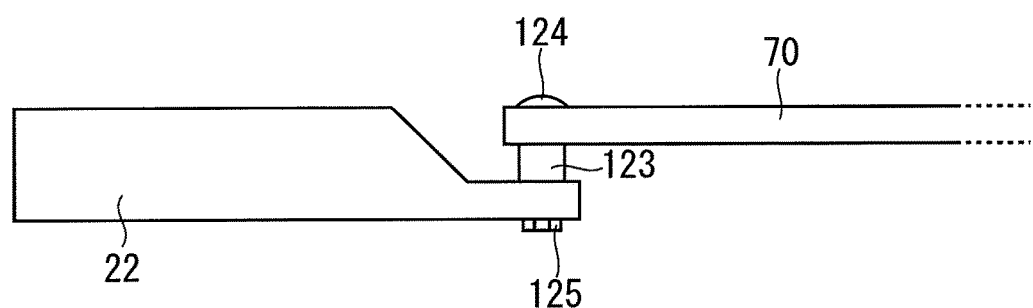
FIG. 14 shows a buffering member provided between the susceptor and a support plate.

FIG. 14 shows a buffering member 123 provided between the susceptor 70 and the support plate 22. A tip end portion of the support plate 22 and an end portion of the susceptor 70 are fastened with a bolt 124 and a nut 125. In the fifth preferred embodiment, the buffering member 123 is interposed between the tip end portion of the support plate 22 and the end portion of the susceptor 70. The buffering member 123 can be an elastic member of a hollow cylindrical shape to let the bolt 124 pass therethrough, for example. Various publicly known materials such as flexible resin materials are applicable as this elastic member.

Except for the buffering member 123 provided between the susceptor 70 and the support plate 22, the structure of the fifth preferred embodiment is the same as that of the first preferred embodiment. Procedure of process on a semiconductor wafer W of the fifth preferred embodiment is the same as that of the first preferred embodiment (FIG. 6). Specifically, after the semiconductor wafer W transported into the chamber 6 by a transport robot outside the apparatus is placed on the four transfer pins 12 of the transfer unit 10, the susceptor 70 moves up to receive the semiconductor wafer W and hold the semiconductor wafer W thereon. Next, the arms 11 in a pair move to the retracted position and the susceptor 70 moves to the preheating position AP.

Next, the semiconductor wafer W is preheated with the 40 halogen lamps HL in the manner of the second, third, or fourth preferred embodiment. After the preheating is finished, the susceptor 70 holding the semiconductor wafer W moves to the flash heating position FP and the semiconductor wafer W is irradiated with flashes from the flash lamps FL. As already described above, flashes emitted from the flash lamps FL are extremely short and intense bursts of light of extremely short light pulses converted from electrostatic energy accumulated in the capacitor to be applied in a time of from 0.1 milliseconds to 100 milliseconds. Irradiating the front surface of the semiconductor wafer W with intense flashes within an extremely short time increases the temperature of the front surface rapidly. Meanwhile, transfer of heat from the front surface to the back surface of the semiconductor wafer W takes time, so that the temperature of the back surface increases slowly after the temperature increase of the front surface. Hence, at the instant when flashes are emitted from the flash lamps FL, only the front surface of the semiconductor wafer W expands rapidly by heat. This deforms the semiconductor wafer W in a manner that causes warpage of the semiconductor wafer W, thereby giving an impact on the susceptor 70.

At this time, in the fifth preferred embodiment, the buffering member 123 provided between the susceptor 70 and the support plate 22 absorbs and relieves an impact on the susceptor 70 due to the deformation of the semiconductor wafer W caused during irradiation with flashes. This prevents a crack in the semiconductor wafer W during irradiation with flashes while preventing the semiconductor wafer W from jumping from the wafer pocket 71 of the susceptor 70. Even if the semiconductor wafer W jumps from the susceptor 70, the buffering member 123 absorbs an impact caused by jumping back of the semiconductor wafer W onto the susceptor 70, thereby preventing a crack in the semiconductor wafer W.

The buffering member 123 also exhibits its buffering effect against elastic deformation of the susceptor 70 caused by the behavior of the semiconductor wafer W in the course of irradiation with flashes, thereby preventing breakage of the susceptor 70.

After the flash heating with the flash lamps FL is finished, the susceptor 70 moves down to transfer the semiconductor wafer W to the transfer pins 12. Then, the transport robot outside the apparatus transports the processed semiconductor wafer W out of the chamber 6, thereby completing the heating process on the semiconductor wafer W.

<Modifications>

In addition to the preferred embodiments of the present invention described above, the present invention can be changed in various ways without departing from the scope of the invention. As an example, in each of the aforementioned preferred embodiments, the chamber 6 has a rectangular columnar shape. However, the chamber 6 housing a semiconductor wafer W of a circular plate shape may be cylindrical. If the chamber 6 is cylindrical, the susceptor 70 becomes circular in a plane. If the chamber 6 is cylindrical, the susceptor 70 may be rotated one turn or more (360 degrees or more) in a horizontal plane during preheating in the fourth preferred embodiment.

In each of the aforementioned preferred embodiments, the flash heating unit 5 and the halogen heating unit 4 are arranged above and below the chamber 6 respectively. The flash heating unit 5 and the halogen heating unit 4 may be reversed in their positions. Additionally, a semiconductor wafer W may be transported into the chamber 6 after being turned upside down. In either case, the front surface of the semiconductor wafer W is irradiated with light from the halogen lamps HL, whereas the back surface of the semiconductor wafer W is irradiated with flashes from the flash lamps FL. Specifically, what is required in the preferred embodiments is to irradiate one surface of a semiconductor wafer W with light from the halogen lamps HL and to irradiate an opposite surface of the semiconductor wafer W with flashes from the flash lamps FL.

In each of the aforementioned preferred embodiments, a total of eight through holes 73 for transfer and retraction are formed in the susceptor 70. Instead, four slits may be formed in the susceptor 70 along paths of movement of the four transfer pins 12 in the horizontal direction.

In each of the aforementioned preferred embodiments, the horizontal movement mechanism 13 of the transfer unit 10 moves the transfer pins 12 in the horizontal direction. Instead, the four transfer pins 12 may be fixed to the chamber 6. As an example, the four transfer pins 12 may be provided in upright position on the lower chamber window 64 forming the floor part of the chamber 6. If the four transfer pins 12 are fixed completely, the preheating position AP and the flash heating position FP should be above the upper ends of the transfer pins 12.

The heights of the preheating position AP and the flash heating position FP relative to each other can be determined arbitrarily. Specifically, the preheating position AP and the flash heating position FP are heights optimum for preheating and flash heating respectively, so the preheating position AP can be above the flash heating position FP, for example. Meanwhile, it is generally preferable that a semiconductor wafer W to be processed be close as possible to a light source. Thus, as in each of the aforementioned preferred embodiments, the flash heating position FP is above the preheating position AP.

In the second preferred embodiment, the preheating position AP is at the center of the preheating moving range AR. However, this is not the only position of the preheating position AP but the preheating position AP may be at any height within the preheating moving range AR.

In the third preferred embodiment, the tilting motors 25 in a pair tilt the susceptor 70. Instead, the susceptor 70 may be tilted by making the two up-and-down driving units 20 place the respective support plates 22 at different heights. In this case, the susceptor 70 is rotated about the X axis to be tilted relative to a horizontal plane. Or, the support plates 22 may be placed at different heights by the two up-and-down driving units 20 while the susceptor 70 is tilted by the tilting motors 25, thereby tilting the susceptor 70 about two axes.

Three or more up-and-down driving units 20 may be provided. Operating the three or more up-and-down driving units 20 in a completely synchronized manner allows the susceptor 70 to move up and down while maintaining the susceptor 70 in a horizontal posture, as in each of the aforementioned preferred embodiments. Operating the three or more up-and-down driving units 20 in an asynchronous manner allows the susceptor 70 to be tilted relative to a horizontal plane, as in the third preferred embodiment.

One up-and-down driving unit 20 may be provided. If the number of the up-and-down driving units 20 is one, the up-and-down driving unit 20 moves the susceptor 70 up and down while supporting the susceptor 70 at one side. In this case, a mechanism for rotating and tilting the susceptor 70 about the X axis may be provided at the upper end of the support shaft 23.

In each of the aforementioned preferred embodiments, 30 flash lamps FL are provided in the flash heating unit 5. However, the number of the flash lamps FL is not limited to 30 but it can be determined arbitrarily. Further, the flash lamps FL are not limited to xenon flash lamps but they may also be krypton flash lamps. Additionally, the number of the halogen lamps HL in the halogen heating unit 4 is not limited to 40 but it can be determined arbitrarily.

A substrate to be processed by the thermal processing apparatus of the present invention is not limited to a semiconductor wafer but it may also be a glass substrate used for a flat panel display such as a liquid crystal display or a substrate for a solar cell. The technique of the present invention is applicable to bonding of metal and silicon or crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus for heating a substrate by irradiating the substrate with light, comprising:
    a chamber that houses a substrate;
    a susceptor that holds the substrate placed thereon inside said chamber;
    a halogen lamp that preheats the substrate held on said susceptor to a given preheating temperature by irradiating one surface of the substrate with light;
    a flash lamp that irradiates an opposite surface of the preheated substrate with a flash;
    an up-and-down driving unit that moves said susceptor up and down and thereby adjusts the distance between said susceptor and said halogen lamp and the distance between said susceptor and said flash lamp;
    an up-and-down controller that controls said up-and-down driving unit to move said susceptor holding the substrate to a first position for preheating with said halogen lamp and to move said susceptor to a second position farther away from said halogen lamp than said first position for irradiation with a flash from said flash lamp; and further comprising a tilting mechanism that tilts said susceptor relative to a horizontal plane.

2. A thermal processing apparatus for heating a substrate by irradiating the substrate with light, comprising:
    a chamber that houses a substrate;
    a susceptor that holds the substrate placed thereon inside said chamber;
    a halogen lamp that preheats the substrate held on said susceptor to a given preheating temperature by irradiating one surface of the substrate with light;
    a flash lamp that irradiates an opposite surface of the preheated substrate with a flash;
    an up-and-down driving unit that moves said susceptor up and down and thereby adjusts the distance between said susceptor and said halogen lamp and the distance between said susceptor and said flash lamp;
    an up-and-down controller that controls said up-and-down driving unit to move said susceptor holding the substrate to a first position for preheating with said halogen lamp and to move said susceptor to a second position farther away from said halogen lamp than said first position for irradiation with a flash from said flash lamp; and
    further comprising a buffering mechanism that absorbs an impact on said susceptor.

3. A thermal processing method for heating a substrate by irradiating the substrate with light, comprising the steps of:
    (a) moving a susceptor holding a substrate placed thereon up and down inside a chamber to adjust the distance between said susceptor and the halogen lamp and move said susceptor to a first position;
    (b) preheating the substrate held on said susceptor to a given preheating temperature by irradiating one surface of the substrate with light emitted from a halogen lamp;
    (c) moving said susceptor up and down to a second position farther away from said halogen lamp than said first position, the step (c) being performed after said step (b);
    (d) irradiating an opposite surface of the preheated substrate with a flash emitted from a flash lamp; and
    wherein in said step (b), said susceptor is tilted relative to a horizontal plane.

* * * * *